US009620503B1

(12) United States Patent
Liao et al.

(10) Patent No.: US 9,620,503 B1
(45) Date of Patent: Apr. 11, 2017

(54) FIN FIELD EFFECT TRANSISTOR AND METHOD FOR FABRICATING THE SAME

(71) Applicant: Taiwan Semiconductor Manufacturing Co., Ltd., Hsinchu (TW)

(72) Inventors: Chin-I Liao, Tainan (TW); Shih-Chieh Chang, Taipei (TW); Chun-Ju Huang, Chiayi (TW); Chien-Wei Lee, Kaohsiung (TW); Chii-Ming Wu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/941,662

(22) Filed: Nov. 16, 2015

(51) Int. Cl.
*H01L 27/088* (2006.01)
*H01L 29/06* (2006.01)
*H01L 29/78* (2006.01)
*H01L 21/8234* (2006.01)
*H01L 21/762* (2006.01)
*H01L 21/311* (2006.01)

(52) U.S. Cl.
CPC .... *H01L 27/0886* (2013.01); *H01L 21/31111* (2013.01); *H01L 21/76224* (2013.01); *H01L 21/823431* (2013.01); *H01L 21/823481* (2013.01); *H01L 29/0649* (2013.01); *H01L 29/7848* (2013.01)

(58) Field of Classification Search
CPC .......... H01L 27/0886; H01L 21/31111; H01L 21/76224; H01L 21/823431; H01L 21/823481; H01L 29/0649; H01L 29/7848

USPC ......................................................... 257/401
See application file for complete search history.

(56) References Cited

U.S. PATENT DOCUMENTS

| | | | | |
|---|---|---|---|---|
| 8,440,517 B2* | 5/2013 | Lin | ................... | H01L 29/66795 257/E21.224 |
| 8,941,153 B2* | 1/2015 | Lee | ................. | H01L 21/823431 257/288 |
| 9,293,534 B2* | 3/2016 | Tsai | .................... | H01L 29/0847 |
| 2011/0133292 A1* | 6/2011 | Lee | ................. | H01L 21/823431 257/401 |
| 2012/0091538 A1* | 4/2012 | Lin | ................... | H01L 29/66795 257/401 |
| 2013/0200455 A1* | 8/2013 | Lo | ..................... | H01L 29/66795 257/347 |
| 2013/0228876 A1* | 9/2013 | Mor | .................. | H01L 29/66545 257/401 |
| 2013/0244387 A1* | 9/2013 | Cho | .................. | H01L 21/76224 438/283 |
| 2013/0273705 A1* | 10/2013 | Liu | ................. | H01L 21/823431 438/283 |
| 2014/0117419 A1* | 5/2014 | Juengling | ....... | H01L 21/823431 257/288 |

(Continued)

*Primary Examiner* — Earl Taylor
(74) *Attorney, Agent, or Firm* — Jianq Chyun IP Office (57) ABSTRACT

A FinFET including a substrate, a plurality of isolators, a gate stack, and strained material portions is provided. The substrate includes at least two fins thereon. The isolators are disposed on the substrate, and each of the insulators between the fins has a recess profile. The gate stack is disposed over portions of the fins and over the insulators. The strained material portions cover the fins revealed by the gate stack. In addition, a method for fabricating the FinFET is provided.

20 Claims, 12 Drawing Sheets

(56) References Cited

U.S. PATENT DOCUMENTS

| | | | |
|---|---|---|---|
| 2014/0170840 A1* | 6/2014 | Tsai | H01L 29/68 |
| | | | 438/492 |
| 2014/0353767 A1* | 12/2014 | Liu | H01L 21/845 |
| | | | 257/401 |
| 2015/0076609 A1* | 3/2015 | Xie | H01L 29/785 |
| | | | 257/365 |
| 2015/0129934 A1* | 5/2015 | Xie | H01L 27/0886 |
| | | | 257/192 |
| 2015/0171217 A1* | 6/2015 | Kim | H01L 29/7851 |
| | | | 257/401 |
| 2015/0179503 A1* | 6/2015 | Tsai | H01L 21/76224 |
| | | | 257/347 |
| 2015/0179644 A1* | 6/2015 | Akarvardar | H01L 21/823431 |
| | | | 257/401 |
| 2015/0228763 A1* | 8/2015 | Lin | H01L 29/66795 |
| | | | 257/401 |
| 2015/0255542 A1* | 9/2015 | Cai | H01L 29/1054 |
| | | | 257/401 |
| 2015/0270342 A1* | 9/2015 | Tsai | H01L 29/0847 |
| | | | 257/43 |

* cited by examiner

FIN FIELD EFFECT TRANSISTOR AND METHOD FOR FABRICATING THE SAME

BACKGROUND

As the semiconductor devices keeps scaling down in size, three-dimensional multi-gate structures, such as the fin-type field effect transistor (FinFET), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel. Profile of source/drain (S/D) is critical for device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary manufacturing process of FinFETs and the FinFETs fabricated there-from. The FinFET may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

Figure 1:
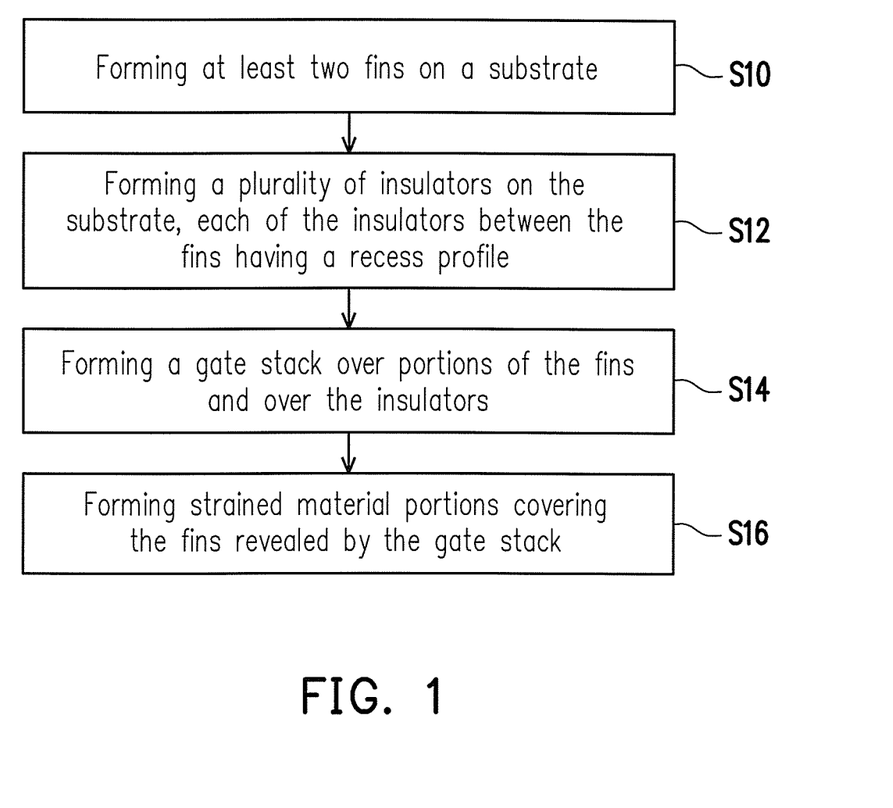
FIG. 1 is a flow chart illustrating a method for fabricating a FinFET in accordance with some embodiments.

Referring to FIG. 1, illustrated is a flow chart illustrating a method for fabricating a FinFET in accordance with some embodiments of the present disclosure. The method at least includes steps S10, step S12, step S14 and step S16. First, in step S10, at least two fins are formed on a substrate. Then, in step S12, a plurality of isolators are formed on the substrate and each of the isolators is located between the fins and has a recess profile. The insulators are shallow trench isolation (STI) structures for insulating or isolating fins, for example. Thereafter, in step S14, a gate stack is formed over portions of the fins and over the insulators; in step S16, strained material portions are formed to cover the fins revealed by the gate stack. As illustrated in FIG. 1, the strained material portions are formed after formation of the gate stack. However, formation sequence of the gate stack (step S14) and the strained material (step S16) is not limited in the present disclosure.

Figure 2A:
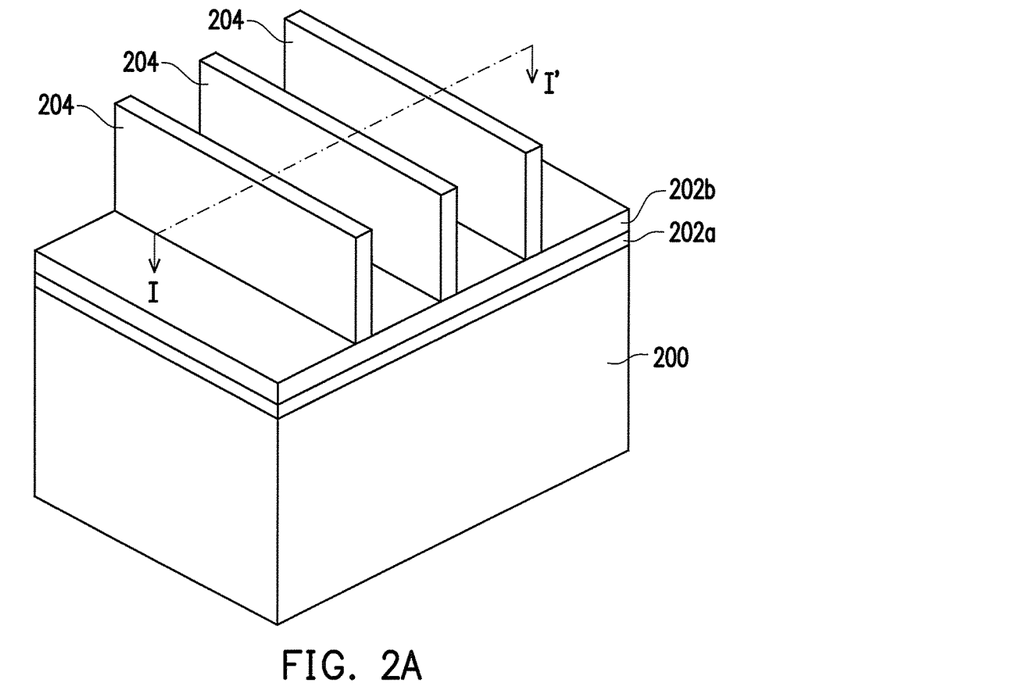
FIGS. 2A-2H are perspective views of a method for fabricating a FinFET in accordance with some embodiments.
Figure 3A:
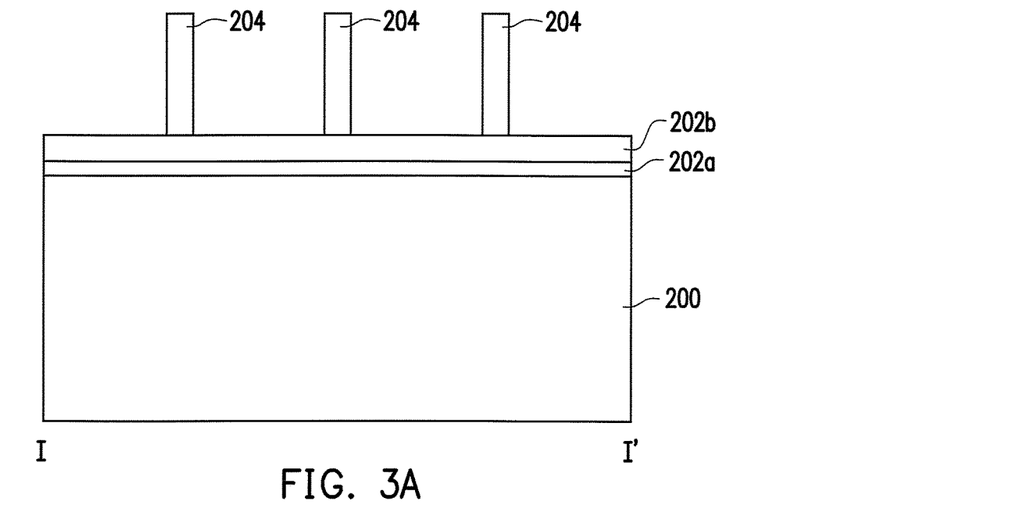
FIGS. 3A-3H are cross-sectional views of a method for fabricating a FinFET in accordance with some embodiments.

FIG. 2A is a perspective view of the FinFET at one of various stages of the manufacturing method, and FIG. 3A is a cross-sectional view of the FinFET taken along the line I-I' of FIG. 2A. In Step 10 in FIG. 1 and as shown in FIG. 2A and FIG. 3A, a substrate 200 is provided. In one embodiment, the substrate 200 comprises a crystalline silicon substrate (e.g., wafer). The substrate 200 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET. In some alternative embodiments, the substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a pad layer 202a and a mask layer 202b are sequentially formed on the substrate 200. The pad layer 202a may be a silicon oxide thin film formed, for example, by thermal oxidation process. The pad layer 202a may act as an adhesion layer between the substrate 200 and mask layer 202b. The pad layer 202a may also act as an etch stop layer for etching the mask layer 202b. In at least one embodiment, the mask layer 202b is a silicon nitride layer formed, for example, by low-pressure chemical vapor deposition (LPCVD) or plasma enhanced chemical vapor deposition (PECVD). The mask layer 202b is used as a hard mask during subsequent photolithography processes. A patterned photoresist layer 204 having a predetermined pattern is formed on the mask layer 202b.

Figure 2B:
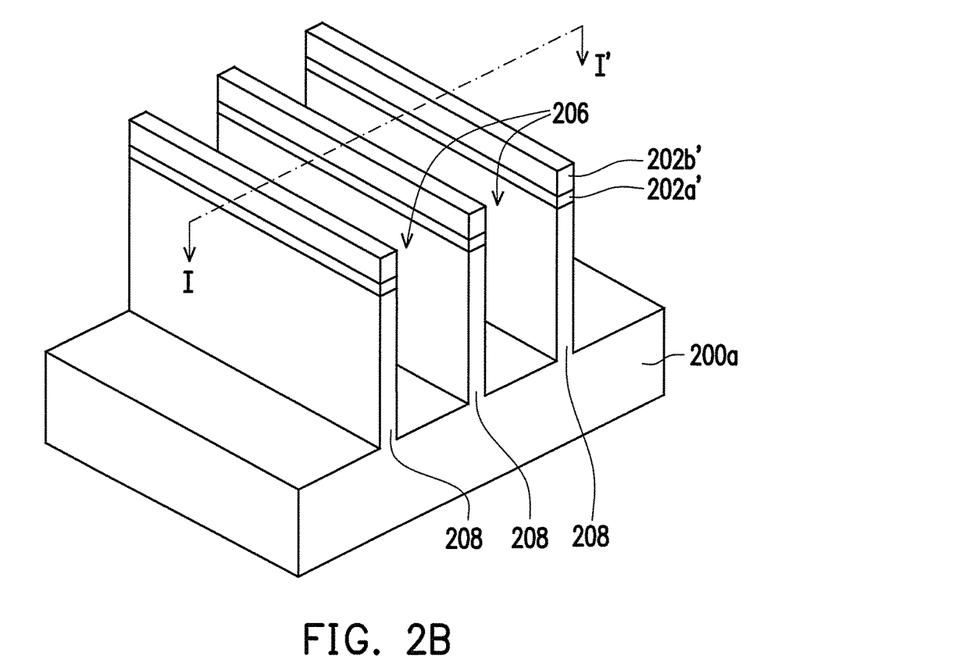
Figure 3B:
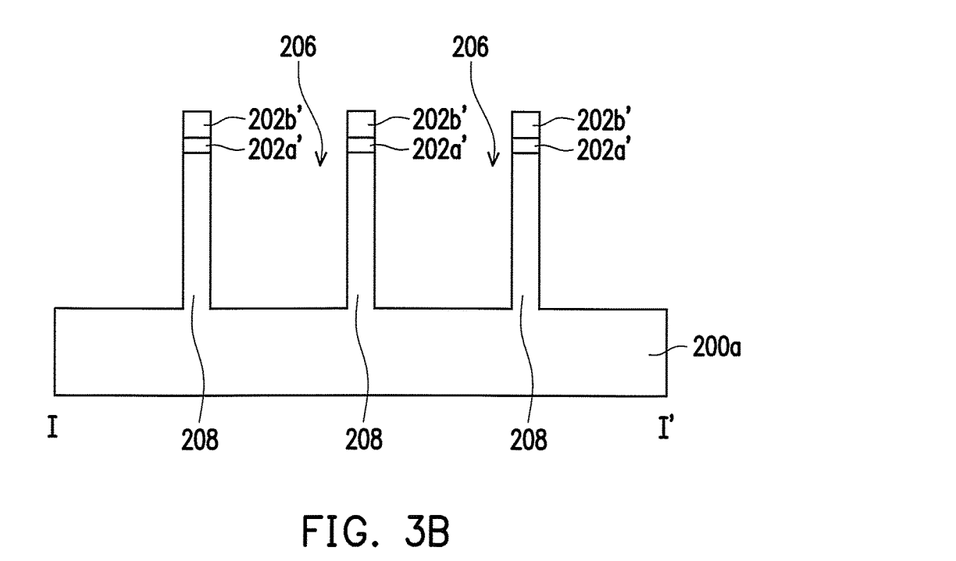

FIG. 2B is a perspective view of the FinFET at one of various stages of the manufacturing method, and FIG. 3B is a cross-sectional view of the FinFET taken along the line I-I' of FIG. 2B. In Step S10 in FIG. 1 and as shown in FIGS. 2A-2B and FIGS. 3A-3B, the mask layer 202b and the pad layer 202a which are not covered by the patterned photoresist layer 204 are sequentially etched to form a patterned mask layer 202b' and a patterned pad layer 202a' so as to expose underlying substrate 200. By using the patterned mask layer 202b', the patterned pad layer 202a' and the patterned photoresist layer 204 as a mask, portions of the substrate 200 are exposed and etched to form trenches 206 and fins 208. The fins 208 are covered by the patterned mask layer 202b', the patterned pad layer 202a' and the patterned photoresist layer 204. Two adjacent trenches 206 are spaced apart by a spacing. For example, the spacing between trenches 206 may be smaller than about 30 nm. In other words, two adjacent trenches 206 are spaced apart by a corresponding fin 208. After the trenches 206 and the fins 208 are formed, the patterned photoresist layer 204 is then removed. In one embodiment, a cleaning process may be performed to remove a native oxide of the substrate 200a and the fins 208. The cleaning process may be performed using diluted hydrofluoric (DHF) acid or other suitable cleaning solutions.

Figure 2C:
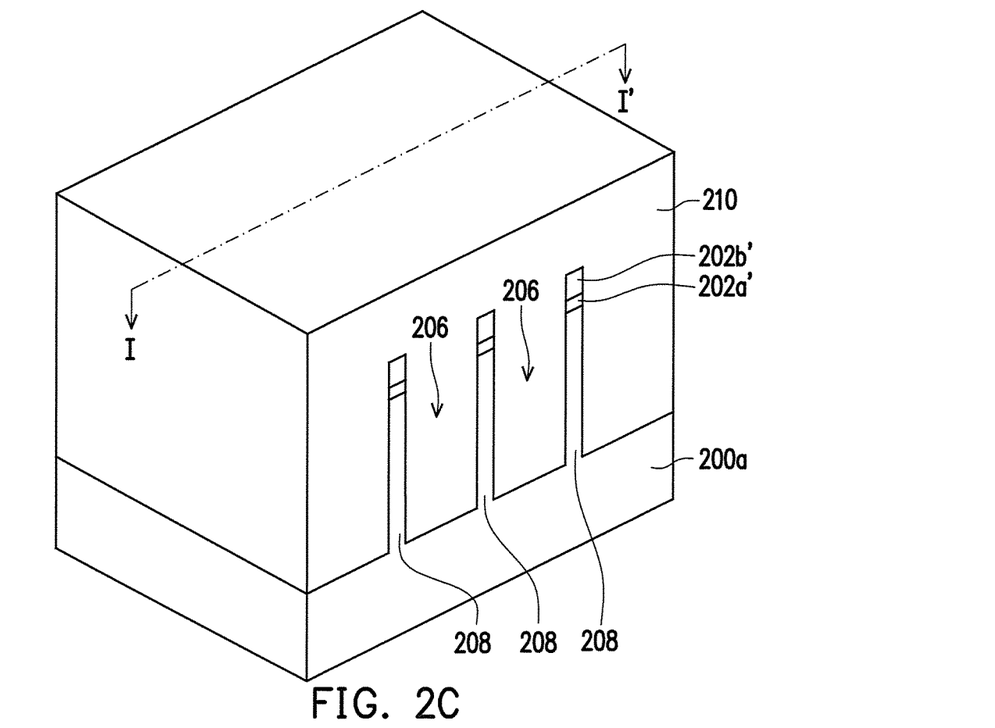
Figure 3C:
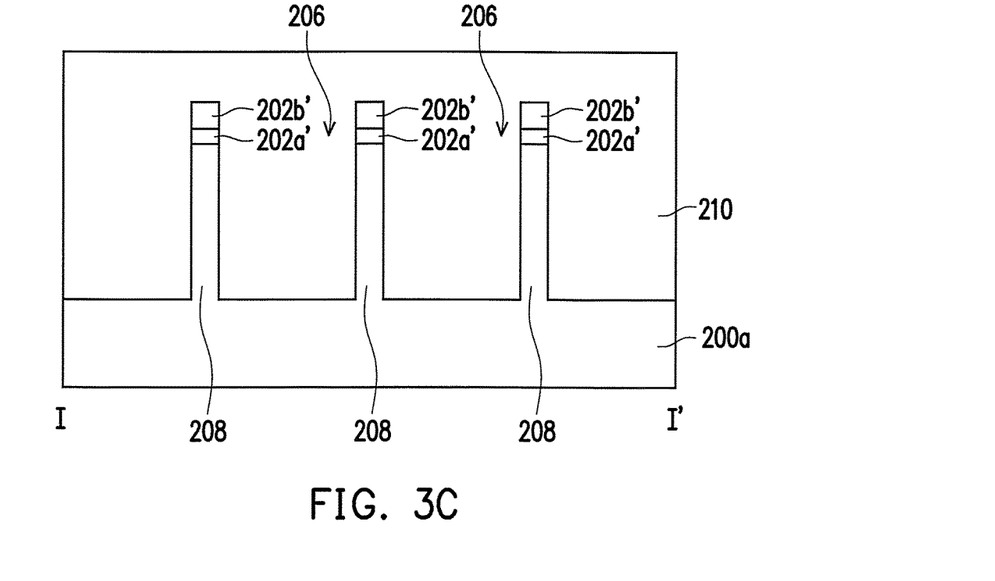

FIG. 2C is a perspective view of the FinFET at one of various stages of the manufacturing method, and FIG. 3C is a cross-sectional view of the FinFET taken along the line I-I' of FIG. 2C. In Step S12 in FIG. 1 and as shown in FIGS. 2B-2C and FIG. 3B-3C, an insulating material 210 is formed over the substrate 200a to cover the fins 208 and fill up the trenches 206. In addition to the fins 208, the insulating material 210 further covers the patterned pad layer 202a' and the patterned mask layer 202b'. The insulating material 210 may include silicon oxide, silicon nitride, silicon oxynitride, a spin-on dielectric material, or a low-K dielectric material. The insulating material 210 may be formed by high-density-plasma chemical vapor deposition (HDP-CVD), sub-atmospheric CVD (SACVD) or by spin-on.

Figure 2D:
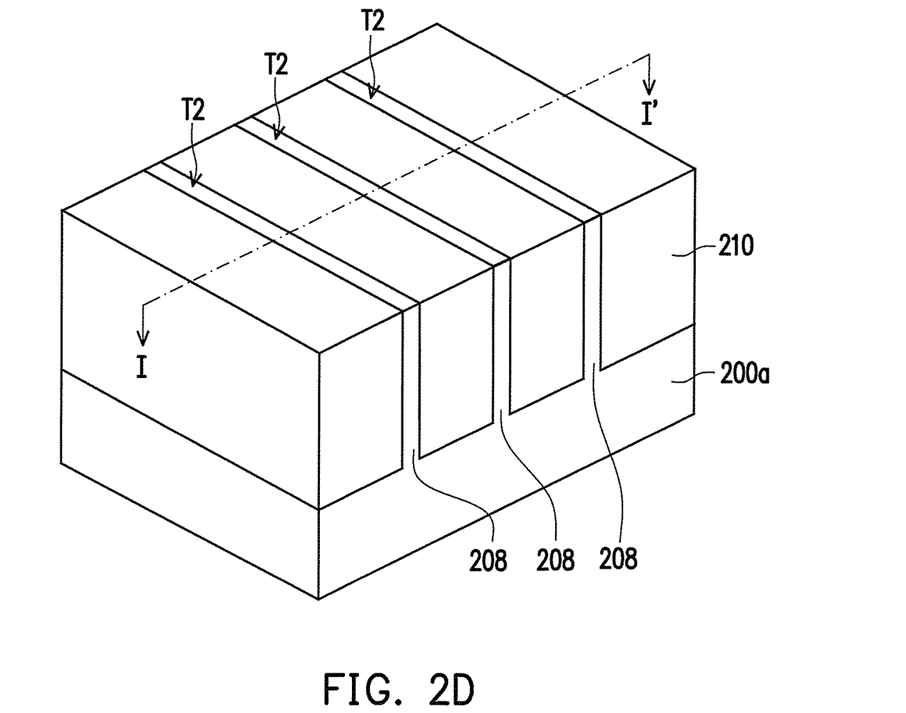
Figure 3D:
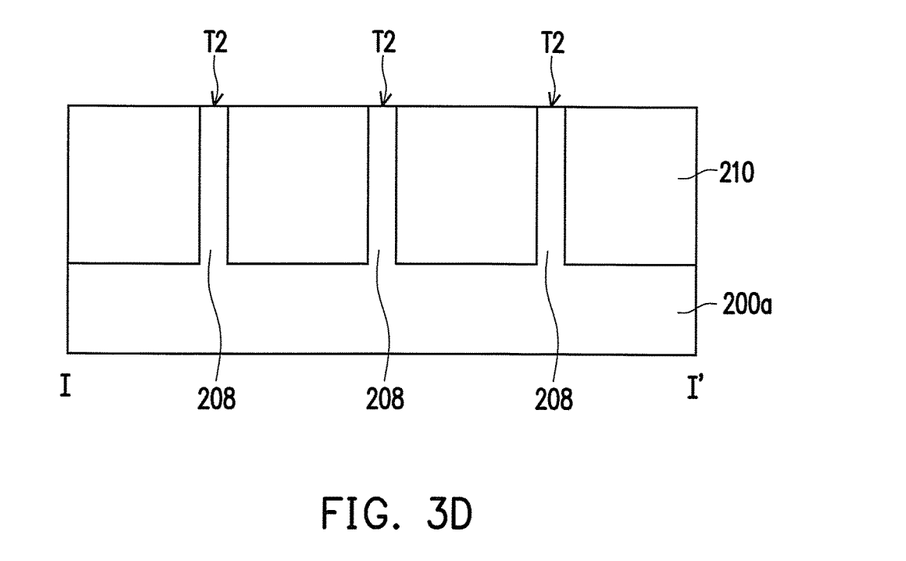

FIG. 2D is a perspective view of the FinFET at one of various stages of the manufacturing method, and FIG. 3D is a cross-sectional view of the FinFET taken along the line I-I' of FIG. 2D. In Step S12 in FIG. 1 and as shown in FIGS. 2C-2D and FIGS. 3C-3D, a chemical mechanical polish process is, for example, performed to remove a portion of the insulating material 210, the patterned mask layer 202b' and the patterned pad layer 202a' until the fins 208 are exposed. As shown in FIG. 2D and FIG. 3D, after the insulating material 210 is polished, top surfaces of the polished insulating material 210 is substantially coplanar with top surface T2 of the fins 208.

Figure 2E:
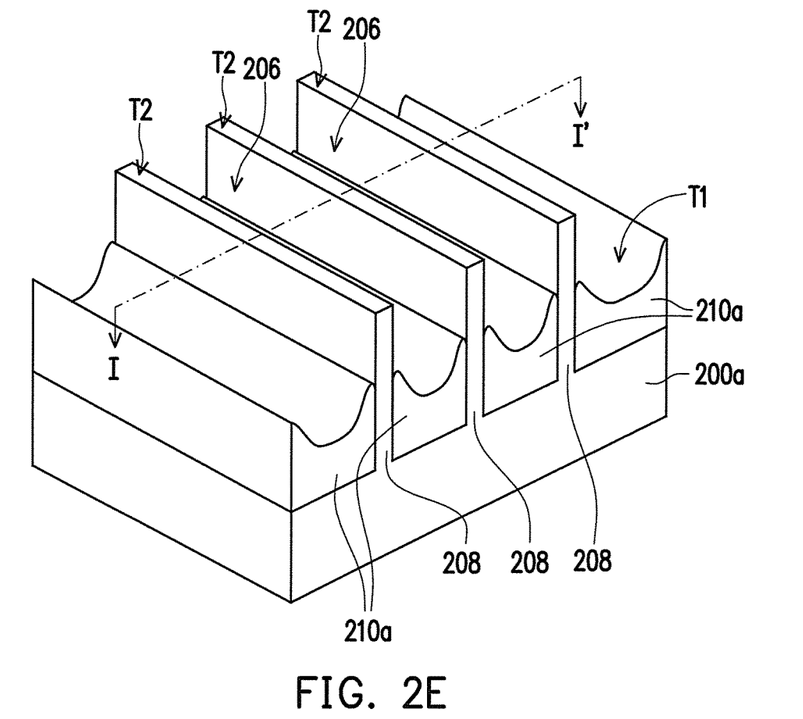
Figure 3E:
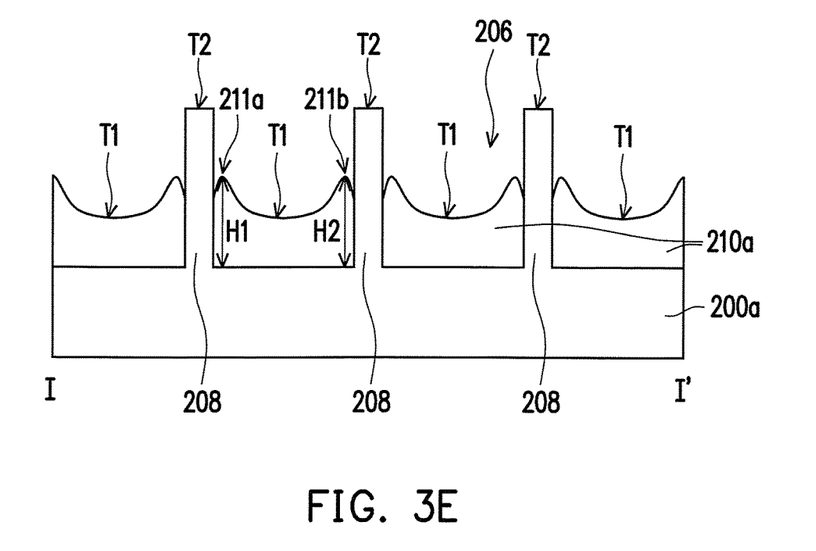

FIG. 2E is a perspective view of the FinFET at one of various stages of the manufacturing method, and FIG. 3E is a cross-sectional view of the FinFET taken along the line I-I' of FIG. 2E. In Step S12 in FIG. 1 and as shown in FIGS. 2D-2E and FIGS. 3D-3E, the polished insulating material 210 filled in the trenches 206 is partially removed by an etching process such that insulators 210a are formed on the substrate 200a and each insulator 210a is located between two adjacent fins 208. In one embodiment, the insulator 210a located between two adjacent fins 208 includes a first protruded portion 211a and a second protruded portion 211b to form a recess profile. The recess profile of the isolator 210a may also be called a smile curve profile. The top surfaces T1 with smile curve of the insulators 210a are lower than the top surfaces T2 of the fins 208. The first protruded portion 211a has a height H1, the second protruded portion 211b has a height H2, and a height difference between height H1 and height H2 is less than 3 nm. That is, the height difference between the first protruded portion 211a and the second protruded portion 211b is less than 3 nm.

In some embodiments, the etching process for forming the isolators 210a may be a wet etching process or a dry etching process. In one embodiment, a wet etching process is performed for forming the isolators 210a, and the etchants may include hydrofluoric acid (HF), hydrogen peroxide, or other suitable etchants. In another embodiment, a dry etching process is performed for forming the isolators 210a, and the etching gas may include $NF_3$, hydrofluoric acid or other suitable etch gases.

Figure 2F:
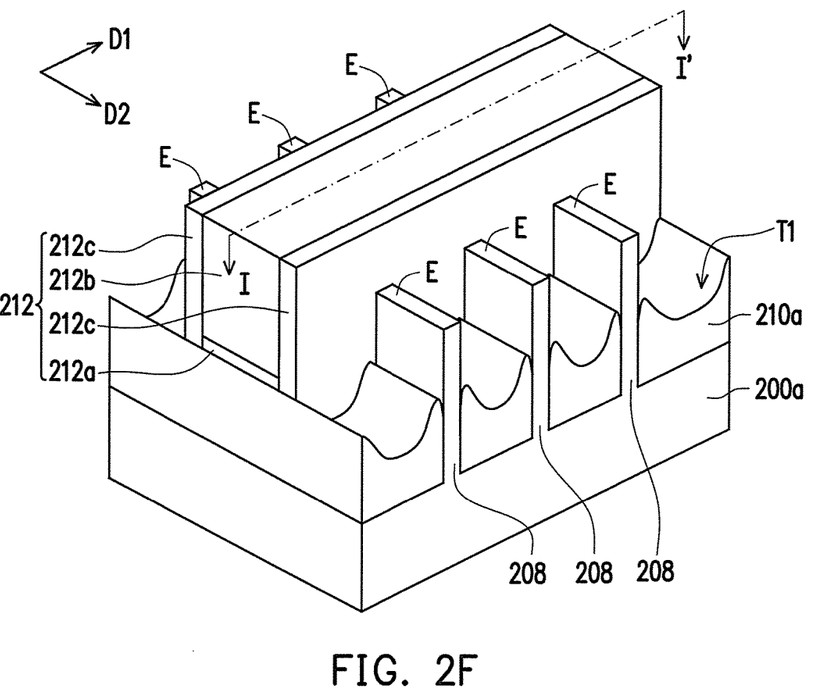
Figure 3F:
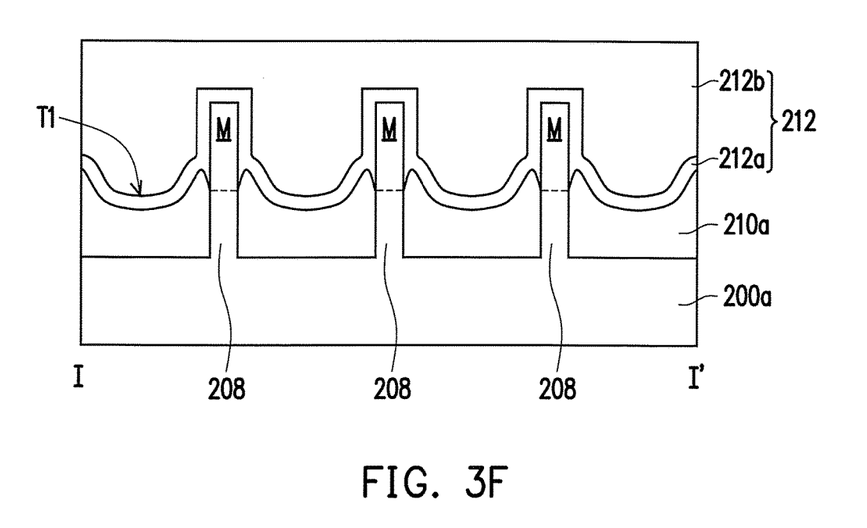

FIG. 2F is a perspective view of the FinFET at one of various stages of the manufacturing method, and FIG. 3F is a cross-sectional view of the FinFET taken along the line I-I' of FIG. 2F. In Step S14 in FIG. 1 and as shown in FIGS. 2E-2F and FIGS. 2F-3F, a gate stack 212 is formed over portions of the fins 208 and portion of the insulators 210a. In one embodiment, the extending direction D1 of the gate stack 212 is, for example, perpendicular to the extension direction D2 of the fins 208 so as to cover the middle portions M (shown in FIG. 3F) of the fins 208. The aforesaid middle portions M may act as channels of the tri-gate FinFET. The gate stack 212 comprises a gate dielectric layer 212a and a gate electrode layer 212b disposed over the gate dielectric layer 212a. The gate dielectric layer 212b is disposed over portions of the fins 208 and over portions of the insulators 210a.

The gate dielectric 212a is formed to cover the middle portions M of the fins 208. In some embodiments, the gate dielectric layer 212a may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the gate dielectric layer 212a is a high-k dielectric layer with a thickness in the range of about 10 to 30 angstroms. The gate dielectric layer 212a may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212a may further comprise an interfacial layer (not shown) to reduce damage between the gate dielectric layer 212a and fins 208. The interfacial layer may comprise silicon oxide.

The gate electrode layer 212b is then formed on the gate dielectric layer 212a. In some embodiments, the gate electrode layer 212b may comprise a single layer or multi-layered structure. In some embodiments, the gate electrode layer 212b may comprise poly-silicon or metal, such as Al, Cu, W, Ti, Ta, TiN, TiAl, TiAlN, TaN, NiSi, CoSi, other conductive materials with a work function compatible with the substrate material, or combinations thereof. In some embodiments, the gate electrode layer 212b includes a silicon-containing material, such as poly-silicon, amorphous silicon or a combination thereof, and is formed prior to the formation of the strained material 214. In some embodiments, the gate electrode layer 212b comprises a thickness in the range of about 30 nm to about 60 nm. The gate electrode layer 212b may be formed using a suitable process such as ALD, CVD, PVD, plating, or combinations thereof.

In addition, the gate stack 212 may further comprise a pair of spacers 212c disposed on sidewalls of the gate dielectric layer 212a and the gate electrode layer 212b. The pair of spacer 212c may further cover portions of the fins 208. The spacers 212c are formed of dielectric materials, such as silicon nitride or SiCON. The spacers 212c may include a single layer or multilayer structure. Portions of the fins 208 that are not covered by the gate stack 212 are referred to as exposed portions E hereinafter.

Figure 2G:
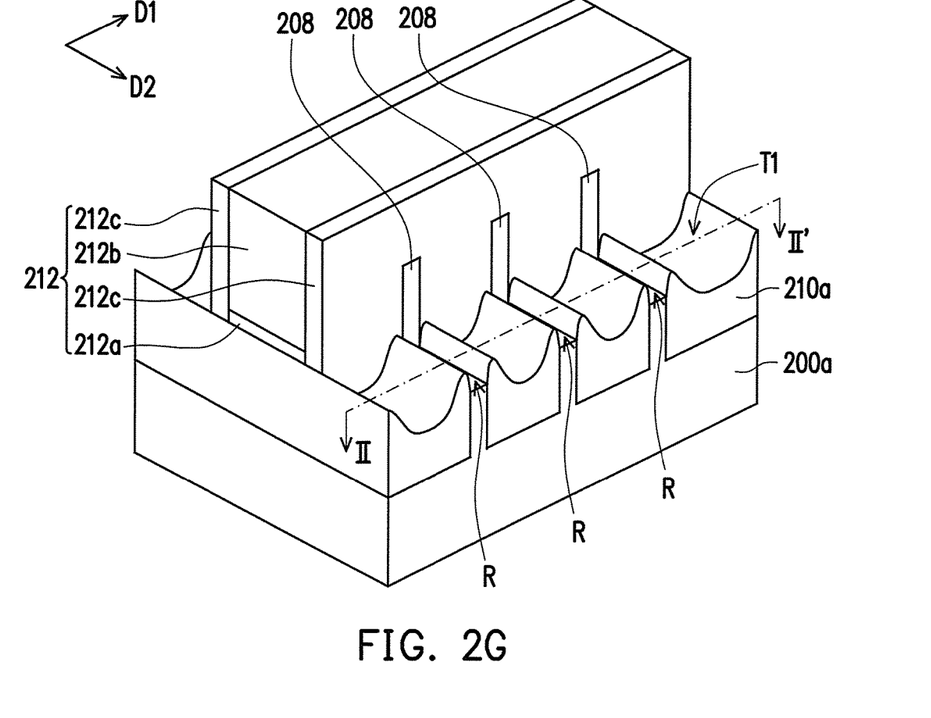
Figure 3G:
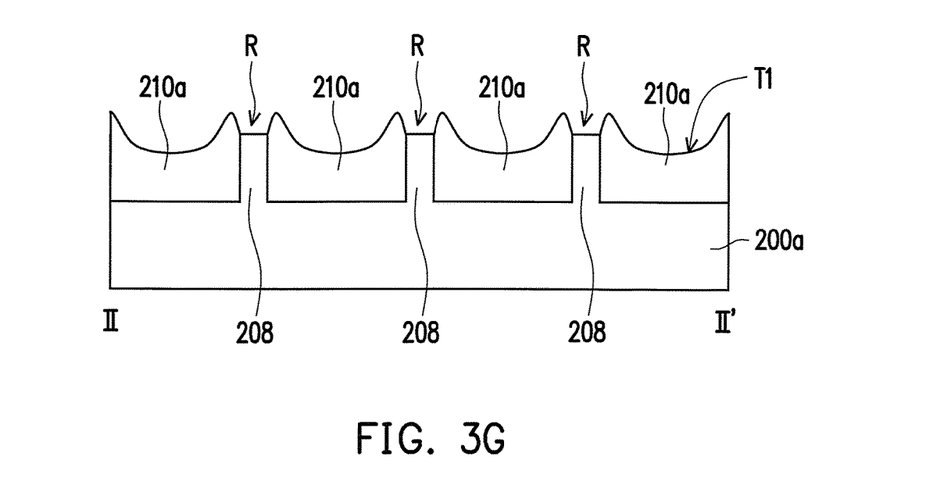

FIG. 2G is a perspective view of the FinFET at one of various stages of the manufacturing method, and FIG. 3G is a cross-sectional view of the FinFET taken along the line II-II' of FIG. 2G. In Step S16 in FIG. 1 and as shown in FIGS. 2F-2G and FIGS. 3F-3G, the exposed portions E of the fins 208 are removed and recessed to formed recessed portions R. For example, the exposed portions E are removed by anisotropic etching, isotropic etching or the combination thereof. In some embodiments, the exposed portions E of the fins 208 are recessed below the top surfaces T1 of the insulators 210a. The depth of the recessed portions R is less than the thickness of the insulators 210a. In other words, the exposed portions E of the fins 208 are not entirely removed. As show in FIG. 2G and FIG. 3G, portions of the fins 208 covered by the gate stack 212 is not removed when the exposed portions E of the fins 208 are recessed. The portions of the fins 208 covered by the gate stack 212 are exposed at sidewalls of the gate stack 212.

Figure 2H:
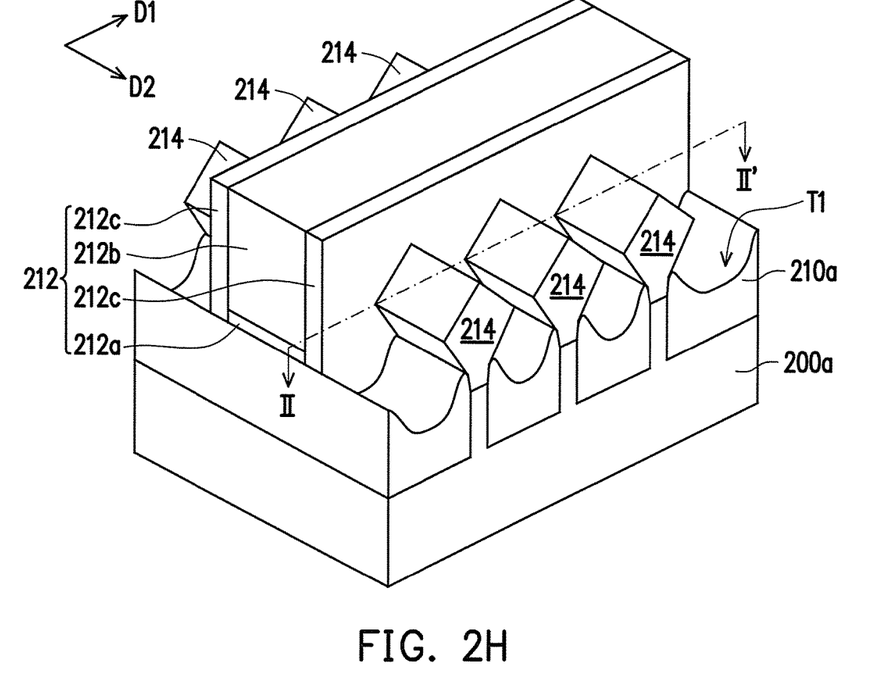
Figure 3H:
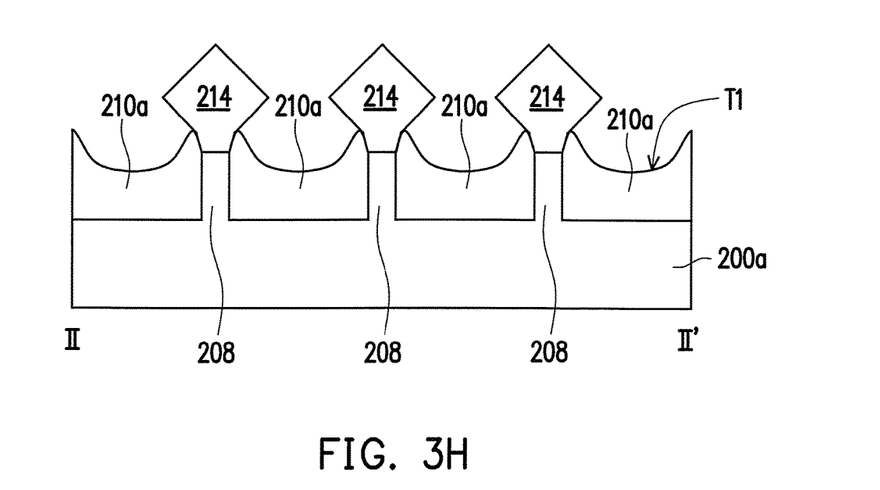

FIG. 2H is a perspective view of the FinFET at one of various stages of the manufacturing method, and FIG. 3H is a cross-sectional view of the FinFET taken along the line II-II' of FIG. 2H. In Step S16 in FIG. 1 and as shown in FIGS. 2G-2H and FIGS. 2G-3H, strained material portions 214 are selectively grown over the recessed portions R of the fins 208 and extend beyond the top surfaces T1 of the insulators 210a to strain or stress the fins 208. As shown in FIG. 2H and FIG. 3H, the strained material portions 214 comprise sources disposed at a side of the stack gate 212 and drains disposed at the other side of the gate stack 212. The sources cover first ends of the fins 208 and the drains cover second ends of the fins 208. In one embodiment, the strained material 214, such as silicon carbon (SiC), is epitaxial-grown by a LPCVD process to form the sources and the drains of the n-type FinFET. In another embodiment, the strained material 214, such as silicon germanium (SiGe), is epitaxial-grown by a LPCVD process to form the sources and the drains of the p-type FinFET.

Figure 4:
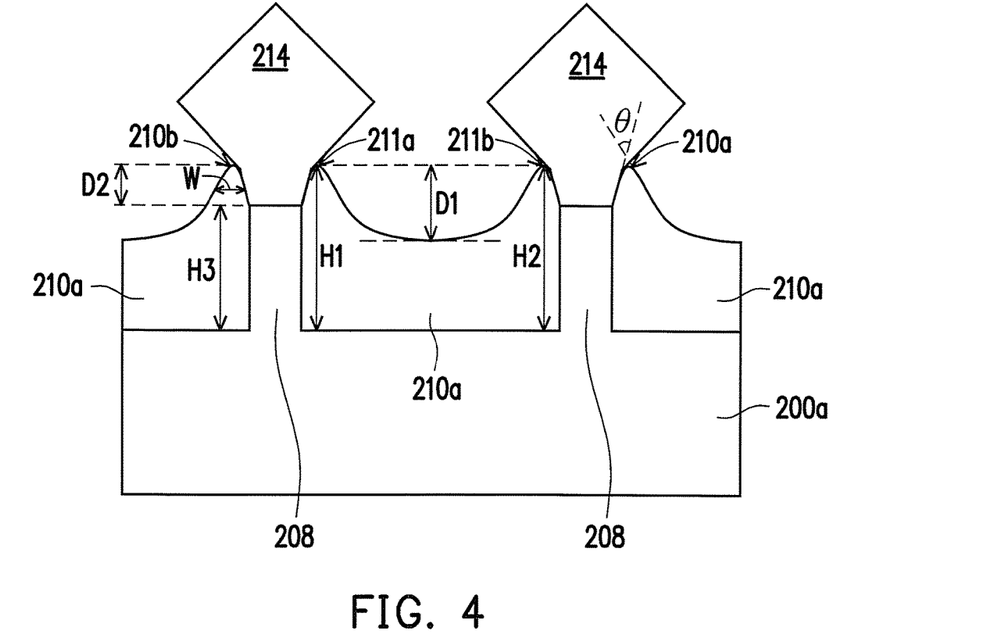
FIG. 4 is an enlarged drawing of FIG. 3H in accordance with some embodiments.

FIG. 4 is an enlarged drawing of FIG. 3H in accordance with some embodiments. As shown in FIG. 3H and FIG. 4, the insulator 210a located between two adjacent fins 208 includes the first protruded portion 211a and the second protruded portion 211b to form the recess profile. The height difference between the first protruded portion 211a and the second protruded portion 211b is less than 3 nm. In this case, a height H3 of the fin 208 is less than the height H1 of the first protruded portion 211a or the height H2 of the second protruded portion 211b. In addition, in accordance with some embodiments, the recess profile of the insulator 210a has a depth D1 greater than 2 nm. The depth D1 is a distance from a bottom of recess profile of the insulator 210a to the top of the first protruded portion 211a or the top of the second protruded portion 211b. A distance D2 from a top of the fin 208 to the top of the first protruded portion 211a or the top of the second protruded portion 211b may be ranged from 5 nm to 7 nm. Moreover, the first protruded portion 211a and the second protruded portion 211b respectively have a full width at half maximum W ranged from 0.5 nm to 5 nm. The full width at half maximum W is a width at half maximum from the top of the fin 208 to the top of the first protruded portion 211a or the top of the second protruded portion 211b. An included angle θ between two tangent lines of two side surface of the first protruded portion 211a or the second protruded portion 211b may be ranged from 1° to 50°, and in some embodiments, the included angle θ may be ranged from 10° to 50°.

In the FinFET of the present disclosure, the height difference between the first protruded portion 211a and the second protruded portion 211b is less than 3 nm, and thus the recess profile of the insulator 210a is symmetry. When the strained material portions 214 are grown after the isolators 210a are formed, the isolators 210a having the symmetry recess profile contribute the strained material portions 214 to have a symmetry profile. The strained material portions 214 with the symmetry profile can improve FinFET device performance and yield.

Figure 5:
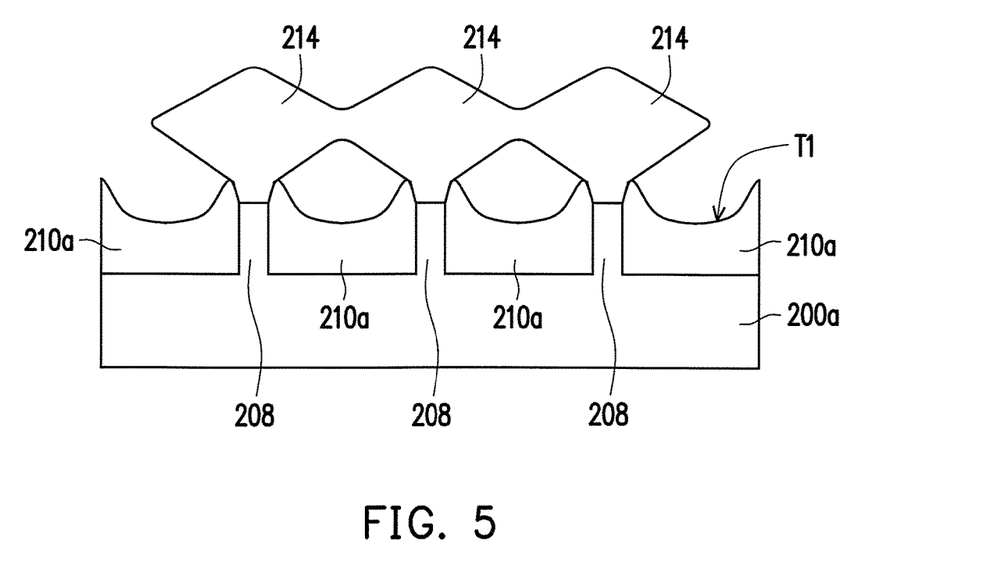
FIG. 5 is a cross-sectional view illustrating a FinFET in accordance with some embodiments.

FIG. 5 is a cross-sectional view illustrating a FinFET in accordance with some embodiments. The FinFET shown in FIG. 5 is a modified embodiment. For details, in the FinFET shown in FIG. 2H and FIG. 3H, the strained material portions 214 include the sources covering the first ends of the fins 208 and the drains covering the second ends of the fins 208, and the sources covering the first ends of the fins 218 are separated from one another so as to form a plurality of source patterns, and the drains covering the second ends of the fins 218 are also separated from one another so as to form a plurality of drain patterns. In the FinFET of FIG. 5, the strained material portions 214 include the sources covering the first ends of the fins 208 and the drains covering the second ends of the fins 208, and the sources covering the first ends of the fins 218 are connected to one another to form a single source pattern, and the drains covering the second ends of the fins 218 are connected to one another to form a single drain pattern.

Figure 6:
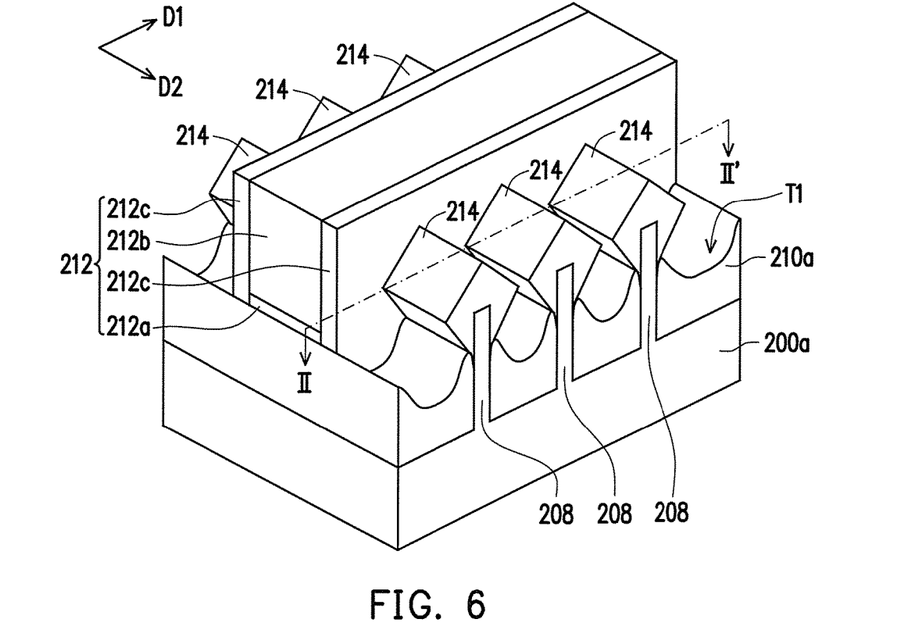
FIG. 6 is a perspective view of a FinFET in accordance with some embodiments.
Figure 7:
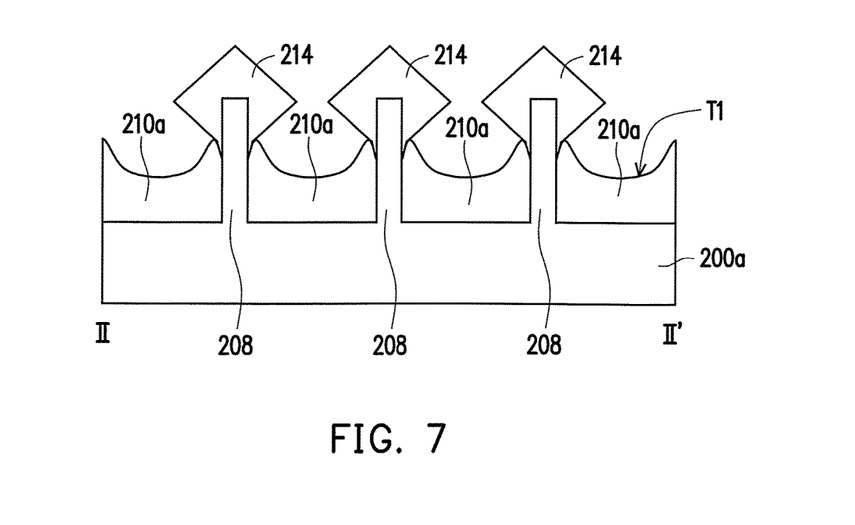
FIG. 7 is cross-sectional view of a FinFET in accordance with some embodiments.

FIG. 6 is a perspective view of the FinFET, and FIG. 7 is a cross-sectional view of the FinFET taken along the line II-II' of FIG. 6. In the embodiment, the fabricating steps for the FinFET include performing the process steps the same with or similar to the steps showing in FIGS. 2A-2F and FIGS. 3A-3F. Therefore, the formed isolator 210a also has a recess profile. After forming the fins 208, the isolators 210a and the gate stack 212, the strained material portions 214 are selectively grown over the fins 208 and extend beyond the top surfaces T1 of the insulators 210a, as shown in FIG. 6 and FIG. 7. In one embodiment, the strained material portions 214, such as silicon carbon (SiC), are epitaxial-grown by a LPCVD process to form the sources and drains of the n-type FinFET. In another embodiment, the strained material portions 214, such as silicon germanium (SiGe), are epitaxial-grown by a LPCVD process to form the sources and drains of the p-type FinFET. In this case, since the fin 208 is not formed with a recessed portion, the top of the fin 208 is higher than the top surface T1 of the insulator 210a.

In accordance with some embodiments, before forming the strained material portions 214, a pre-epitaxial process is performed. The pre-epitaxial process may also adjust the profile of the isolator 210a to have a symmetry recess profile. In an embodiment, the pre-epitaxial process is performed with a dry etching or a wet etching.

Figure 8:
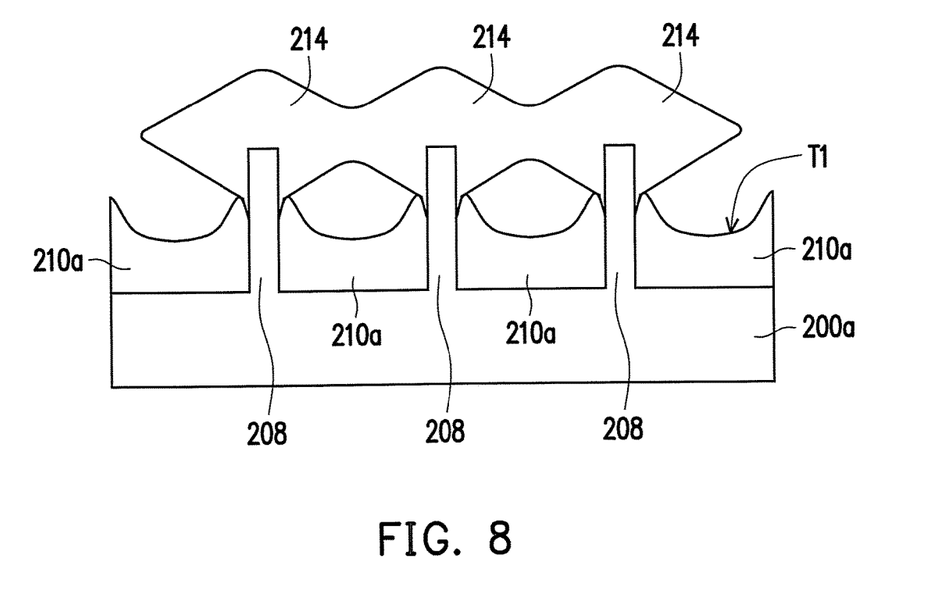
FIG. 8 is a cross-sectional view illustrating a FinFET in accordance with some embodiments.

FIG. 8 is a cross-sectional view illustrating a FinFET in accordance with some embodiments. The FinFET shown in FIG. 8 is a modified embodiment corresponding to the embodiment shown in FIG. 6 and FIG. 7. For details, in the FinFET shown in FIG. 6 and FIG. 7, the strained material portions 214 include the sources covering the first ends of the fins 208 and the drains covering the second ends of the fins 208, and the sources covering the first ends of the fins 218 are separated from one another so as to form a plurality of source patterns, and the drains covering the second ends of the fins 218 are also separated from one another so as to form a plurality of drain patterns. In the FinFET of FIG. 8, the strained material portions 214 include the sources covering the first ends of the fins 208 and the drains covering the second ends of the fins 208, and the sources covering the first ends of the fins 218 are connected to one another to form a single source pattern, and the drains covering the second ends of the fins 218 are connected to one another to form a single drain pattern.

In accordance with some embodiments of the present disclosure, a FinFET includes a substrate, a plurality of isolators, a gate stack, and strained material portions. The substrate includes at least two fins thereon. The isolators are disposed on the substrate, and each of the insulators between the fins includes a recess profile. The gate stack is disposed over portions of the fins and over the insulators. The strained material portions cover the fins revealed by the gate stack.

In accordance with some embodiments of the present disclosure, a FinFET includes a substrate, a plurality of isolators, a gate stack, and strained material portions. The substrate includes at least two fins thereon. Each of the fins on the substrate has a recessed portion. The isolators are disposed on the substrate. Each of the insulators includes a first protruded portion and a second protruded portion to form a recess profile, and a height difference between the first protruded portion and the second protruded portion is less than 3 nm. The gate stack is disposed over portions of the fins and over the insulators. The strained material portions fill the recessed portions of the fins and covering the fins revealed by the gate stack.

In accordance with some embodiments of the present disclosure, a method of fabricating a FinFET includes at least the following steps. A substrate is provided, and the substrate is patterned to form at least two fins and a plurality of trenches. An insulating material is formed on the substrate to cover the fins and fill the trenches. A portion of the insulating material is removed to form a plurality of isolators in the trench, and each of the insulators has a recess profile. A gate stack is formed over portions of the fins and over portions of the insulators. Strained material portions are formed over the fins revealed by the gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A fin field effect transistor (FinFET), comprising:
a substrate having at least two fins thereon;
a plurality of isolators disposed on the substrate, each of the isolators between the fins comprising a recess profile, wherein each of the isolators having the recess profile comprises a first protruded portion and a second protruded portion respectively with a rounded top portion and a bottom portion being wider than the rounded top portion, and;
a gate stack, disposed over portions of the fins and over the isolators; and
strained material portions covering the fins revealed by the gate stack.

2. The transistor of claim 1, wherein a height difference between the first protruded portion and the second protruded portion is less than 3 nm.

3. The transistor of claim 2, wherein the first protruded portion and the second protruded portion respectively have a full width at half maximum ranged from 0.5 nm to 5 nm.

4. The transistor of claim 2, wherein a height of each of the fins is less than a height of the first protruded portion or the second protruded portion of each of the isolators.

5. The transistor of claim 2, wherein a height of each the fins is greater than a height of the first protruded portion or the second protruded portion of each of the isolators.

6. The transistor of claim 1, wherein the recess profile of each of the isolators has a depth greater than 2 nm.

7. The transistor of claim 1, wherein the strained material portions comprise at least two sources covering first ends of the fins and at least two drains covering second ends of the fins, the first ends and the second ends are revealed by the gate stack, the sources covering the first ends of the fins are separated from each other, and the drains covering the second ends of the fins are separated from each other.

8. The transistor of claim 1, wherein the strained material portions comprise at least two sources covering first ends of the fins and at least two drains covering second ends of the fins, the first ends and the second ends are revealed by the gate stack, the sources covering the first ends of the fins are connected each other, and the drains covering the second ends of the fins are connected to each other.

9. A fin field effect transistor (FinFET), comprising:
a substrate comprising at least two fins, each of the fins having a recessed portion;
a plurality of isolators disposed on the substrate to isolate the fins, each of the isolators comprising a first protruded portion and a second protruded portion to form a recess profile and a height difference between the first protruded portion and the second protruded portion being less than 3 nm, and the first protruded portion and the second protruded portion respectively having a rounded top portion and a bottom portion being wider than the rounded top portion;
a gate stack, disposed over portions of the fins and over the isolators; and
strained material portions filling the recessed portions of the fins and covering the fins revealed by the gate stack.

10. The transistor of claim 9, wherein the first protruded portion and the second protruded portion respectively have a full width at half maximum ranged from 0.5 nm to 5 nm.

11. The transistor of claim 9, wherein the recess profile of each of the isolators has a depth greater than 2 nm.

12. The transistor of claim 9, wherein the strained material portions comprise at least two sources covering first ends of the fins and at least two drains covering second ends of the fins, the first ends and the second ends are revealed by the gate stack, the sources covering the first ends of the fins are separated from each other, and the drains covering the second ends of the fins are separated from each other.

13. The transistor of claim 9, wherein the strained material portions comprise at least two sources covering first ends of the fins and at least two drains covering second ends of the fins, the first ends and the second ends are revealed by the gate stack, the sources covering the first ends of the fins are connected each other, and the drains covering the second ends of the fins are connected to each other.

14. A method of fabricating a fin field effect transistor (FinFET), comprising:
providing a substrate;
patterning the substrate to form at least two fins and a plurality of trenches;
forming an insulating material on the substrate to cover the fins and fill the trenches;
removing a portion of the insulating material to form a plurality of isolators in the trenches, and each of the isolators comprising a recess profile, wherein each of the isolators having the recess profile comprises a first protruded portion and a second protruded portion respectively with a rounded top portion and a bottom portion being wider than the rounded top portion;
forming a gate stack over portions of the fins and over portions of the isolators; and
forming strained material portions over the fins revealed by the gate stack.

15. The method of claim 14, wherein a height difference between the first protruded portion and the second protruded portion is less than 3 nm.

16. The method of claim 14, wherein each of the isolators having the recess profile is formed by performing an etching process.

17. The method of claim 16, wherein the etching process is performed with a dry etching or a wet etching.

18. The method of claim 14, wherein the strain material is formed by an epitaxial process, and each of the isolators having the recess profile is formed by performing a pre-epitaxial process before the epitaxial process.

19. The method of claim 18, wherein the pre-epitaxial process is performed with a dry etching or a wet etching.

20. The method of claim 11, further comprising partially removing the fins to form recessed portions after forming the gate stack, and the strained material portions filling the recessed portions of the fins.

* * * * *